United States Patent [19]
Takiar et al.

[11] Patent Number: 5,969,783
[45] Date of Patent: Oct. 19, 1999

[54] REFLECTIVE LIQUID CRYSTAL DISPLAY AND CONNECTION ASSEMBLY AND METHOD

[75] Inventors: Hem P. Takiar, Fremont; Ranjan J. Mathew, San Jose, both of Calif.

[73] Assignee: National Semiconductor Corporation, Santa Clara, Calif.

[21] Appl. No.: 09/209,868

[22] Filed: Dec. 11, 1998

[51] Int. Cl.⁶ .................... G02F 1/1345; H01L 23/495; H01L 23/48
[52] U.S. Cl. .................... 349/150; 349/149; 349/152; 257/693; 257/676
[58] Field of Search .................... 349/149, 150, 349/152; 257/676, 693, 778

[56] References Cited

U.S. PATENT DOCUMENTS

| | | | |
|---|---|---|---|
| 5,029,984 | 7/1991 | Adachi et al. | 350/334 |
| 5,072,283 | 12/1991 | Bolger | 357/72 |
| 5,142,644 | 8/1992 | VanSteenkiste et al. | 359/88 |
| 5,328,079 | 7/1994 | Mathew et al. | 228/180.5 |
| 5,339,216 | 8/1994 | Lin et al. | 361/707 |
| 5,468,994 | 11/1995 | Pendse | 257/693 |
| 5,502,289 | 3/1996 | Takiar et al. | 174/266 |
| 5,596,225 | 1/1997 | Mathew et al. | 257/667 |
| 5,721,602 | 2/1998 | Narayan et al. | 349/161 |
| 5,764,314 | 6/1998 | Narayan et al. | 349/187 |
| 5,818,561 | 10/1998 | Nakanishi | 349/149 |
| 5,838,401 | 11/1998 | Uehara | 349/150 |
| 5,859,475 | 1/1999 | Freyman et al. | 257/738 |
| 5,866,949 | 2/1999 | Schueller | 257/778 |

*Primary Examiner*—William L. Sikes
*Assistant Examiner*—Tarifur R. Chowdhury
*Attorney, Agent, or Firm*—Beyer & Weaver, LLP

[57] ABSTRACT

A connection assembly (40) for operably coupling a plurality of independent imaging devices (41, 41';, 41") to an optical subsystem (42). The connection assembly (40) includes a unitary flex circuit device (43) having an elongated arm portion (45), and a plurality independent finger portions (46, 46', 46") extending from a distal end of the arm portion (45). Each finger portion (46, 46', 46") defines a coupling region (47, 47', 47") adapted to operably couple a respective imaging device (41, 41', 41") to a respective finger portion (46, 46', 46") for support thereof. The finger portions (46, 46', 46") are further adapted to strategically couple each respective imaging device (41, 41', 41") to the optical subsystem (42) as a unit. The flex circuit device (30) includes a plurality of circuits (65) terminating at respective terminals (40) of a coupling region (47) thereof. The terminals (66) supportively and communicably coupled to the bond pads (67) of the die (58) for support thereof. The coupling region (47) further includes an adhesive mount (76) mounting the flex circuit device (43) to the transparent plate to supportably suspend the display assembly (57) between the die (58) and the transparent plate (61).

9 Claims, 8 Drawing Sheets

REFLECTIVE LIQUID CRYSTAL DISPLAY AND CONNECTION ASSEMBLY AND METHOD

TECHNICAL FIELD

The present invention relates, generally, to liquid crystal display assemblies and, more particularly, relates to reflective liquid crystal display assemblies and interconnection assemblies.

BACKGROUND ART

In the recent past, substantial research and development resources have been directed toward small scale Liquid Crystal Display (LCD) and light valve technologies. These high information content, miniature LCD assemblies enable enhanced availability of graphics, data and video information for employment in high resolution projection displays, such as a reflective LCD projectors, SXGA formats (1,280× 1,024 pixel resolution) and even HDTV formats (above 1,000 line resolution), or the like.

Reflective LCD projectors, in particular, are highly desirable since they offer the brightness of traditional three-lamp front-projection systems in combination with the high resolution of an LCD panel. At the heart of these optical engines is reflective liquid crystal on crystalline silicon light valve technology which, when combined with sophisticated optical architecture and the appropriate electronic interface, enables very high resolution, high brightness, large screen displays. In one optical engine form, as shown in FIG. 1, full spectrum visible light from an illumination source 13 is directed through a sophisticated polarized beam splitter or prism 14 which separates the light into red, blue and green beam components. Each beam component is then directed into a corresponding red, blue and green reflective LCD panel assembly 20, 20' and 20", each of which is configured to control the amount of light absorbed and reflected. More specifically, each pixel of the pixel array for each LCD panel regulates the amount of red, green, and blue light, respectively, it reflects back into the prism. Subsequently, the prism 14 reintegrates the shades of corresponding red, blue and green light for each pixel to create a single visible color at one convergent location. Collectively, the reintegrated pixels (i.e., from the red LCD panel 20, the blue LCD panel 20' and the green LCD panel 20") create an image which is projected through a lens 15 and onto a screen 16.

Due in part to the complexity of the optical engine 17 and the precise nature of the alignment between the cooperating light valves (i.e., LCD panel assemblies 20, 20' and 20"), the structural and optical coupling to the prism 14 is critical to performance. Current mounting techniques, thus, require completely independent coupling to the prism with independent interconnections to the electronic interfaces. As schematically illustrated in FIG. 1 and as shown in FIGS. 2 an 3, each LCD panel assembly 20, 20' and 20" includes an independent flex circuit device interconnection 18, 18' and 18", respectively, electrically coupling a corresponding respective LCD panel to the electronic interface 19.

One problem associated with the current design of these optical engines is the substantial fabrication costs involved due to the abundance of relatively costly individual interconnections between the LCD panels and the electronic interface. These additional flex circuit device interconnections 18 also increase the space requirements in order to accommodate the individual interconnections. Moreover, manufacture time is increased as well as requiring additional labor resources to connect, position and place the individual flex circuit device interconnections.

Another problem associated with both transmissive and reflective-type LCD panels assemblies is the bowing or warpage of the individual panels caused by residual stresses acting upon the die during operation. This is particularly noticeable in reflective-type LCD panels which have increased flatness requirements due to the nature of the reflective surface of the die. For example, thermal expansion characteristics, as well as lattice mismatching, can generate significant stresses in the underlying substrate material (the silicon), therein causing significant bowing of the mirrored surface. The bowing, which translates to a non-planarity of the surface, causes both (1) a non-uniform thickness of the liquid crystal layer between the bowed reflective surface and the planar transmissive top layer, and (2) variations in the path length of the reflected light from different parts of the element, and of the array. These effects compromise the electro-optic properties of the elements and/or array.

As mentioned, a primary source of these residual stresses originate from the different materials and composites of the LCD panel having different coefficients of expansion. This is best shown in FIGS. 2 and 3 which illustrate a conventional small scale LCD assembly 20 including a die 21 having a pixel array 22. This pixel array 22 is typically composed of rows and columns of electrically conductive pathways each forming an individual pixel (not shown). Each pixel can be individually changed to an "on" condition by selecting the appropriate row and column of pixel array 22. Positioned around or concentrated on one end of the pixel array are a plurality of die bond pads 23 which are internally connected to the pixel array 22 to enable operational control thereof. Selection of the appropriate pixel is controlled by control circuitry, either included within the die 21 or external to the die 21. In either configuration, external control signals may be used to control the functions of the die 21.

A transparent glass plate 24 is typically placed over the die 21 and the pixel array 22, such that a portion of the glass plate 24 overhangs the die 21. The glass plate 24 is usually affixed to die 21 through an adhesive seal 25 which together cooperate to define a sealed volume encompassing the pixel array 22. This sealed volume is then commonly filled with a solution 26 of Polymer Dispersed Liquid Crystals (PDLC). To facilitate grounding of the glass plate 24, a conductive coating (not shown) may be deposited over the undersurface 28 thereof.

The die 21 is typically rigidly or semi-rigidly mounted to a substrate 27 for mounting support and heat conductive dissipation for the die. A conductive adhesive 29 (FIG. 3), such as a conductive epoxy, is generally applied to the undersurface 28 of the die 21 to affix the die directly to the top surface of the substrate 27. Accordingly, a heat conductive pathway is created directly between the die and the substrate to dissipate heat generated by the die.

The flex circuit 18 includes a plurality of flex circuit bond pads 30 which are typically wire bonded to the die bond pads 23 through bonding wires 31. The distal end of flex circuit 18 is coupled to the top surface of substrate 27. Finally, a glob coating 32 is applied to die 21, substrate 27 and the distal end of flex circuit 18. The glob coating 32 (FIG. 3) further normally encapsulates the bonding wires 31 and the die and flex circuit bonding pads 23 and 30 without obscuring a view of the pixel array 22 through the glass plate 24.

As previously indicated, one important aspect in the proper operation of these small scale LCD or light valve assemblies is the maintenance of proper distance uniformity (preferably about 2–4 $\mu$m) between the pixel array and the undersurface 33 of the glass plate. Variances in the separation of the glass plates may often times cause the pixel array to function improperly or cause operational failure.

Conventional rigid display device constructions, for example, often warp during operation since the substrate 27, the glass plate 24 and the silicon die 21 are all composed of materials or composites having different coefficients of expansion. The individual components of the LCD assembly, therefore, often expand at different degrees and rates. Further, depending in part upon the construction processes, such as the adhesive curing techniques, significant residual stresses may be induced upon the cell. Eventually, in severe instances, the glass plate 24 may delaminate from the die 21. At a minimum, these internal stresses cause optical defects such as variations in color uniformity and fringes, and variations in the cell gap thickness may cause optical shadows.

This is especially true since the undersurface 28 of the die 21 is typically rigidly affixed or attached directly to the substrate. Moreover, during low temperature conditioning, the glass plate 24 often fractures due to internal stress induced by the substrate which is then transmitted to the glass through the rigidly mounted die. This is especially problemsome at the regions where the adhesive mounts the die to the substrate, and/or where the glob coating contacts the glass. As shown in FIGS. 2 and 3, the glob coating 32 encapsulating the bonding wires 31 often substantially contacts both the die bond pads as well as portions of the transparent plate 24. While the material composing the glob coating 32, such as ultraviolet curable and thermally curable silicones and epoxies, is relatively flexible, it must be sufficiently rigid to provide a protective barrier for the bonding wires 31. Consequently, the glob coating 32 insulating and protecting the bonding wire 31 induces residual stresses between the die 21 and the transparent plate 24.

DISCLOSURE OF INVENTION

The present invention provides a connection assembly for operably coupling a plurality of independent imaging devices to an optical subsystem adapted to reintegrate images emitted from the respective imaging devices into white light at a convergent location. The connection assembly includes a unitary flex circuit device including an elongated arm portion, and a plurality independent finger portions extending from a distal end of the arm portion. Each finger portion defines a coupling region adapted to operably couple a respective imaging device to a respective finger portion for support thereof. The finger portions are further adapted to strategically couple each respective imaging device to the optical subsystem as a unit.

In one embodiment, the flex circuit device includes three finger portions which, when in an unmounted condition, are oriented about 90° relative an adjacent finger portion. Each finger portion further includes a plurality of circuits terminating at the coupling region, and operably coupled to the respective imaging device through Tape Automated Bonding techniques.

In another aspect of the present invention, an optical system for a reflective projector assembly is provided including a first imaging device, a second imaging device and a third imaging device. Each imaging device includes a pixel array, and each pixel of the corresponding array is configured to regulate the amount of respective red, blue and green light it reflects. The optical system further includes a unitary flex circuit device including an elongated arm portion, and three independent finger portions extending from a distal end of the arm portion. Each finger portion provides a coupling region adapted to operably couple a respective imaging device to a respective finger portion for support thereof. A prism device is further included having a first surface adapted to optically couple to the first imaging device, a second surface adapted to optically couple to the second imaging device, and a third surface adapted to optically couple to the third imaging device. A fourth surface of the prism is configured to receive light emitted from an illumination source. Upon receipt of the light, the prism reintegrates the images reflected from the respective imaging devices into a collective image at a convergent location.

In yet another aspect, a liquid crystal display assembly is provided including a display device having a die having a pixel array, and a transparent plate positioned over the die. An adhesive seal adhesively couples the die to the transparent plate, which together with the transparent plate and the die cooperate to define a sealed volume therebetween encompassing the pixel array. A liquid crystal material is disposed within the sealed volume. A flex circuit device is further included having a plurality of circuits terminating at respective beams of a coupling region thereof. In accordance with the present invention, a Tape Automated Bonding (TAB) interconnection is adapted to electrically couple the respective circuit beams to respective die bond pads.

In one embodiment, the coupling region of the flex circuit device includes an adhesive mount mounting the circuit device to the transparent plate. This mounting supportably suspends the display assembly between the die and the transparent plate in a manner substantially minimizing the transmission of residual stresses induced by or acting upon the die. The circuit beams are coupled to the bond pads at a proximal end of the die, and the adhesive mount suspendably couples the flex circuit device to the transparent plate at an opposite distal end thereof.

The flex circuit device may further include a ground circuit electrically coupled to the adhesive mount. In this configuration, the adhesive mount is adapted to electrically couple the transparent plate to the ground circuit for grounding thereof Further, the proximal end of the die includes a proximal lip portion containing the bond pads and formed to extend beyond a proximal end of the transparent plate. A distal end of the transparent plate includes a distal ledge portion which is formed to extend beyond a distal end of the die to engage the adhesive mount.

Another aspect of the present invention provides a liquid crystal display assembly including ad display device and a flex circuit device. The display device includes a die having a pixel array, and a transparent plate positioned over the die. An adhesive seal adhesively couples the die to the transparent plate, which together with the transparent plate and the die cooperate to define a sealed volume therebetween encompassing the pixel array. A liquid crystal material is disposed within the sealed volume. The flex circuit device includes a plurality of circuits terminating at respective terminals of a coupling region thereof. The terminals supportively and communicably coupled to the bond pads of the die for support thereof. The coupling region of the flex circuit device further includes an adhesive mount mounting the circuit device to the transparent plate to supportably suspend the display assembly between the die and the transparent plate. In this arrangement, the transmission of residual stresses induced by or acting upon the die is substantially minimized.

BRIEF DESCRIPTION OF THE DRAWING

The assembly of the present invention has other objects and features of advantage which will be more readily apparent from the following description of the best mode of carrying out the invention and the appended claims, when taken in conjunction with the accompanying drawing, in which:

BEST MODE OF CARRYING OUT THE INVENTION

Figure 1:
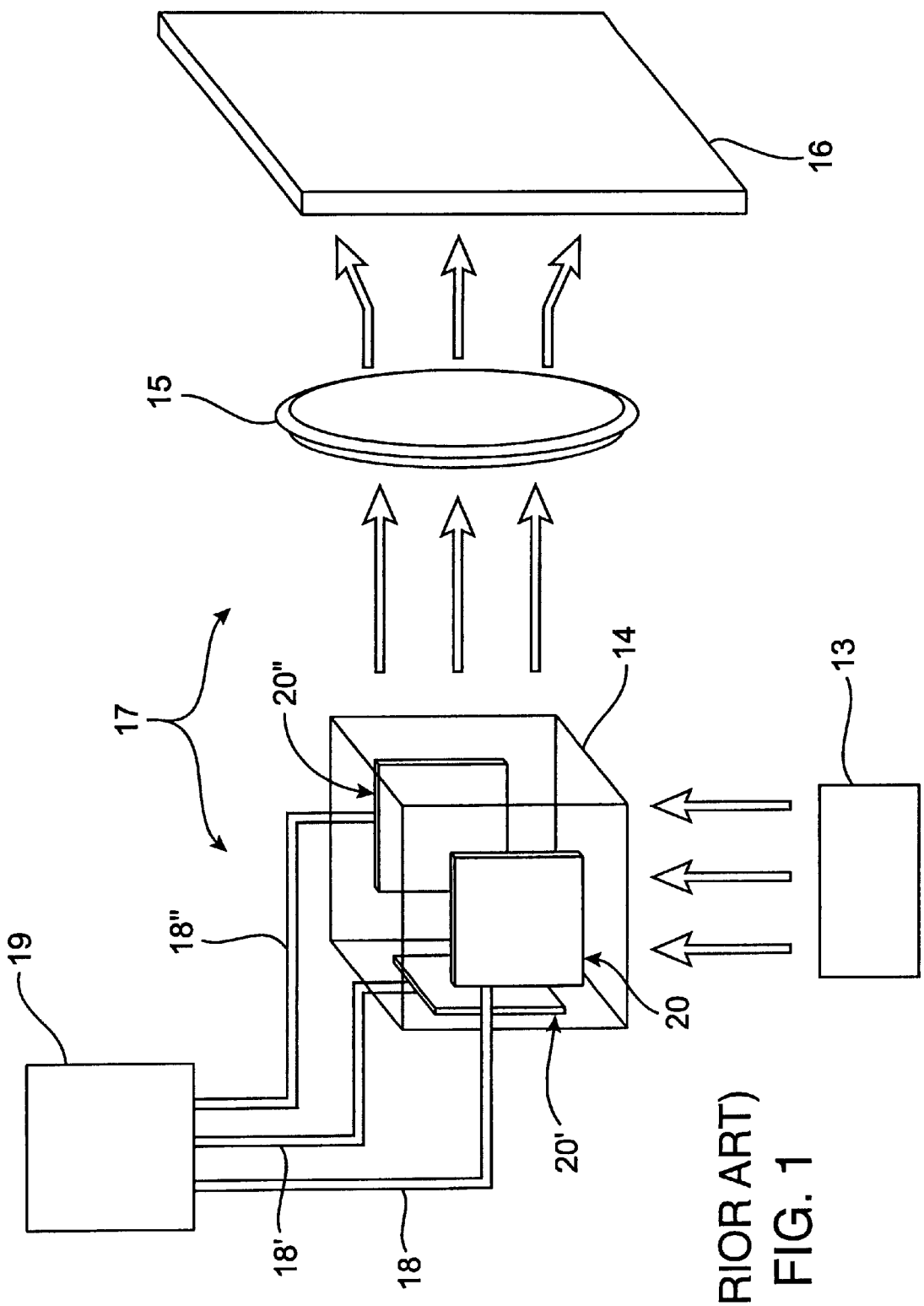
FIG. 1 is a schematic representation of a prior art optical engine for a projection assembly employing three Liquid Crystal Display (LCD) assemblies each interconnected through independent connections.

While the present invention will be described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

Figure 4:
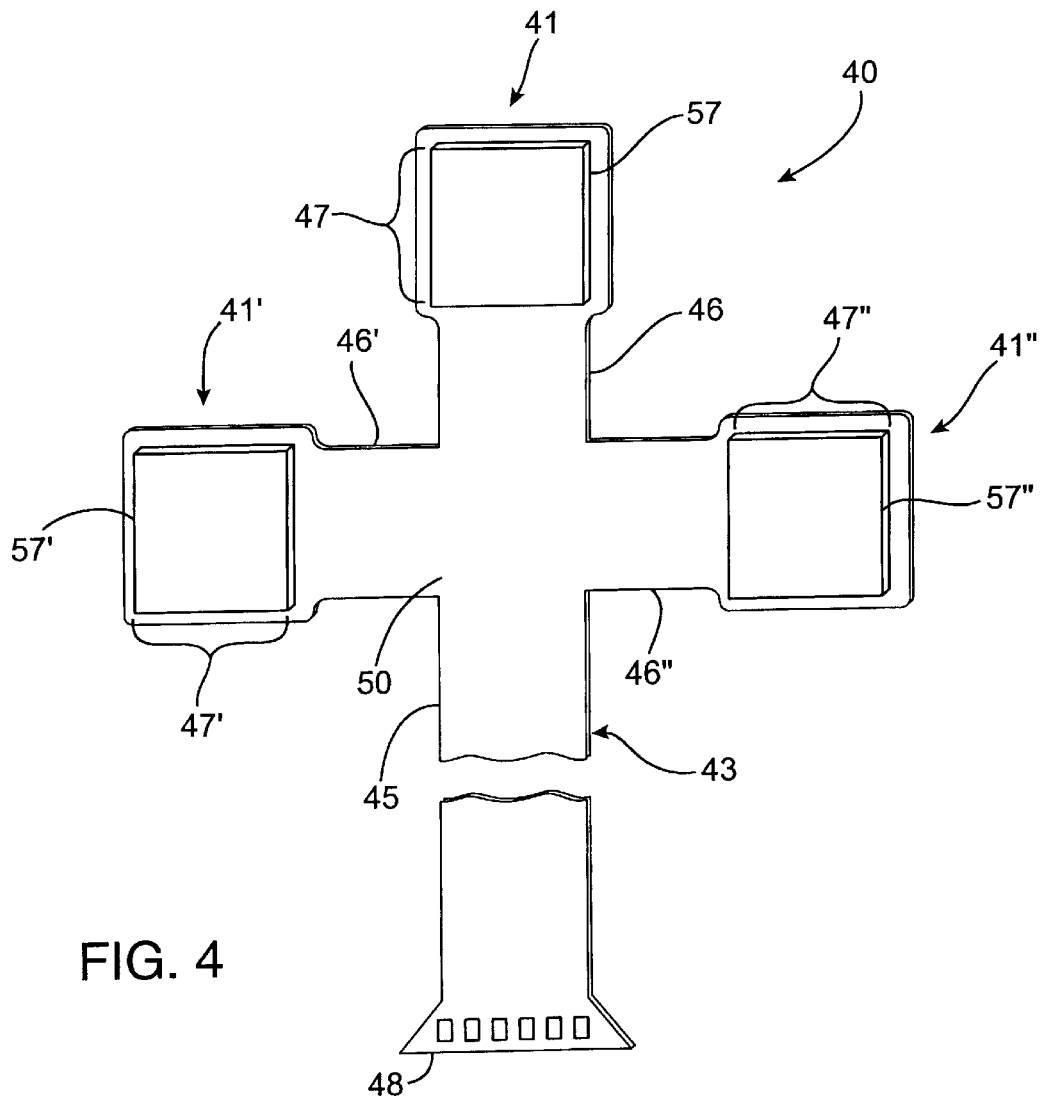
FIG. 4 is a fragmentary, top plan view of a unitary connection assembly constructed in accordance with the present invention having three Liquid Crystal Display (LCD) panel assemblies operably mounted thereto.
Figure 5:
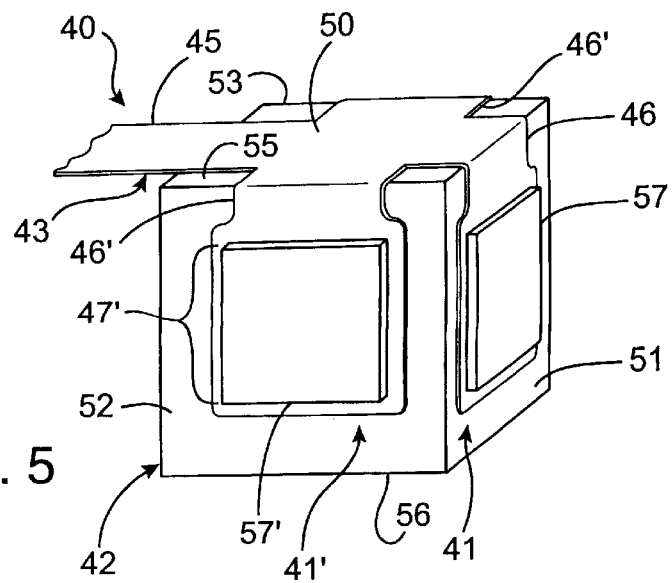
FIG. 5 is a top perspective view of the connection assembly of FIG. 4 mounted to a prism device.

Attention is now directed to FIGS. 4 and 5 where a connection assembly, generally designated 40, of the present invention is illustrated for operably coupling a plurality of independent imaging devices 41, 41' and 41" to an optical projection subsystem 42 adapted to reintegrate images emitted from the respective imaging devices into white light at a convergent location. The connection assembly 40 includes a unitary flex circuit device, generally designated 43, including an elongated arm portion 45, and a plurality independent finger portions 46, 46' and 46" extending from a distal end of the arm portion 45. Each finger portion 46, 46' and 46" defines a coupling region, generally designated 47, 47' and 47", which is adapted to operably couple a respective imaging device to a respective finger portion for support thereof.

Accordingly, a unitary flex circuit device is provided having a plurality of finger portions each of which is strategically oriented to position each respective imaging device at the correct location relative the optical projection subsystem as a unit. This single bus connection system significantly reduces manufacture costs by replacing the plurality of independent flex circuit devices with a single interconnection. Consequently, the necessity of providing multiple electrical connectors coupled to the electronic interface (not shown) is also eliminated.

As best viewed in FIG. 5, once the first of the plurality of imaging devices is properly positioned and mounted to the optical subsystem in a conventional manner, the remaining imaging devices are more easily situated for alignment and mounting onto the optical subsystem. This is due in part to the predetermined positioning and individual lengths of the respective finger portions of the flex circuit device which position the imaging device adjacent the corresponding mounting position on the subsystem.

In the preferred embodiment, the imaging devices 41, 41' and 41" are provided by reflective LCD panel assemblies, while the optical subsystem is preferably provided by a cubic prism device 42. In this arrangement, three LCD panel assemblies are typically employed which cooperate with an electronic interface (not shown) to reflect red, green and blue light, respectively. For instance, in the first LCD panel assembly 41, each pixel of the pixel array is configured to regulate the amount of red light it reflects. Similarly, each pixel of the pixel array of the second LCD panel assembly 41 is configured to regulate the amount of blue light it reflects, while the pixels of the third LCD panel assembly 41 regulate the green light reflected. These optical engine designs are particularly suitable for use in reflective LCD projector assemblies or the like.

FIG. 4 best illustrates that one end of the elongated arm portion 45 of the flex circuit device 43 includes an electrical connector 48 suitable for coupling to a mating connector (not shown) of the electronic interface, while the opposite distal end thereof terminates at an intersection region 50 with the three finger portions 46, 46' and 46". To accommodate mounting to the cubic prism device 42, the finger portions are preferably oriented at about 90° angle relative one another, when in an unmounted condition (FIG. 4). Thus, upon proper orientation of the flex circuit device, the first LCD panel assembly 41 may be mounted to the first surface 51 of the cubic prism device 42 for optical communication therebetween. Similarly, the second LCD panel assembly 41', mounted to the second finger portion 46', and the third LCD panel assembly 41", mounted to the third finger portion 46", will be oriented for mounting to a second surface 52 and a third surface 53 of the cubic prism device 42, respectively. As best viewed in FIG. 5, when the intersection region 50 is positioned on support surface 55 of cubic prism device 42, the respective finger portions are positioned to wrap around the corresponding edge to facilitate orientation of each LCD panel assembly at the proper location.

Accordingly, upon receipt of light emitted from an illumination source in a fourth surface 56 of the prism device 42, the properly aligned and mounted reflective LCD panel assemblies cooperate with the sophisticated prism optical architecture to reintegrate light images reflected from the respective panels into a collective image at a convergent location.

It will be appreciated that while the present invention is preferably illustrated with three LCD panel assemblies, and consequently, a three fingered unitary flex circuit device, any multiple fingered circuit may be provided without departing from the true spirit and nature of the present invention.

Moreover, while only one finger portion of the flex circuit device will be described in detail, the mounting of the remaining LCD panels to their respective finger portions is substantially similar.

Figure 6:
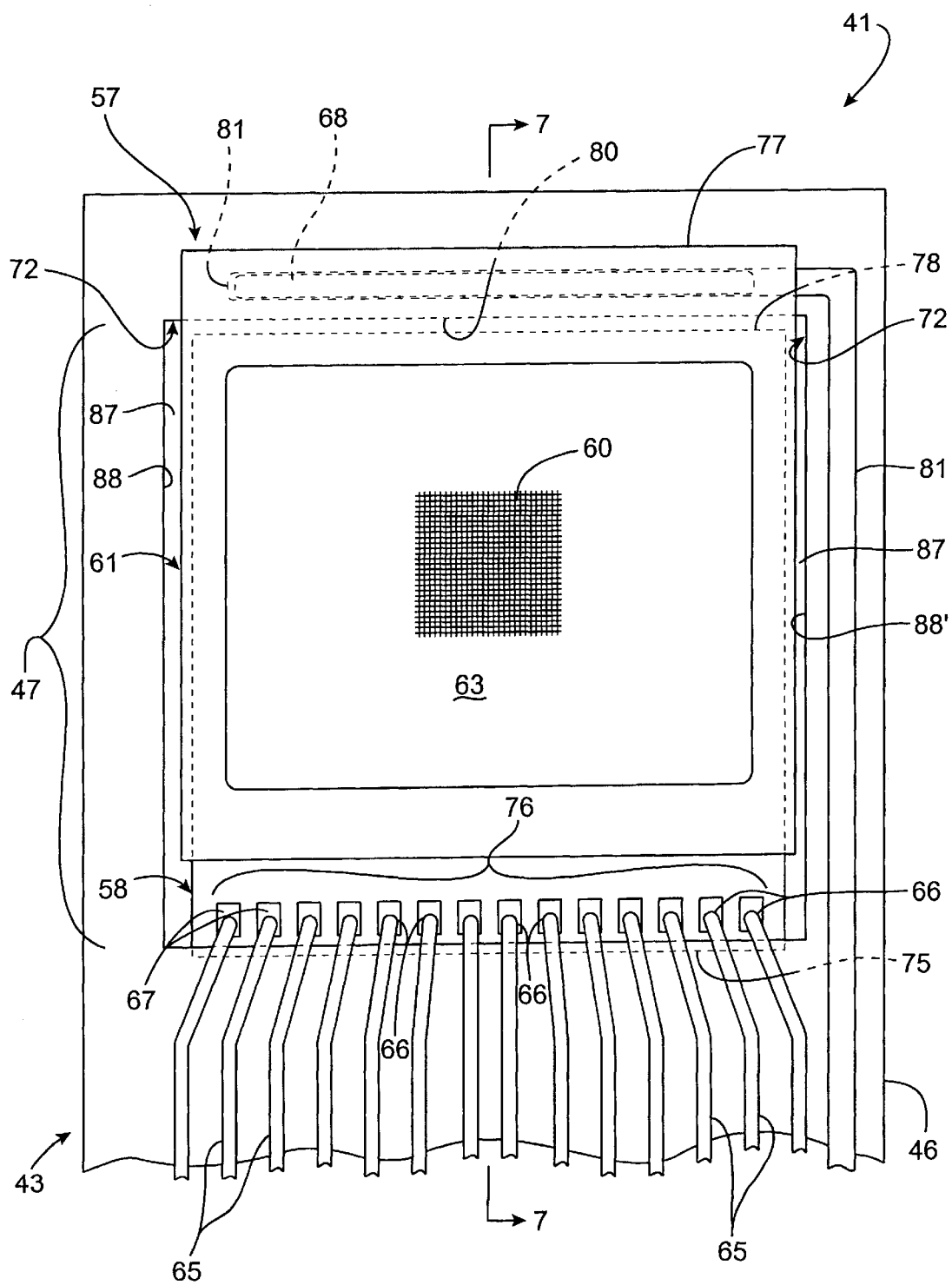
FIG. 6 is a top plan view a Liquid Crystal Display (LCD) panel assembly constructed in accordance with the present invention.
Figure 7:
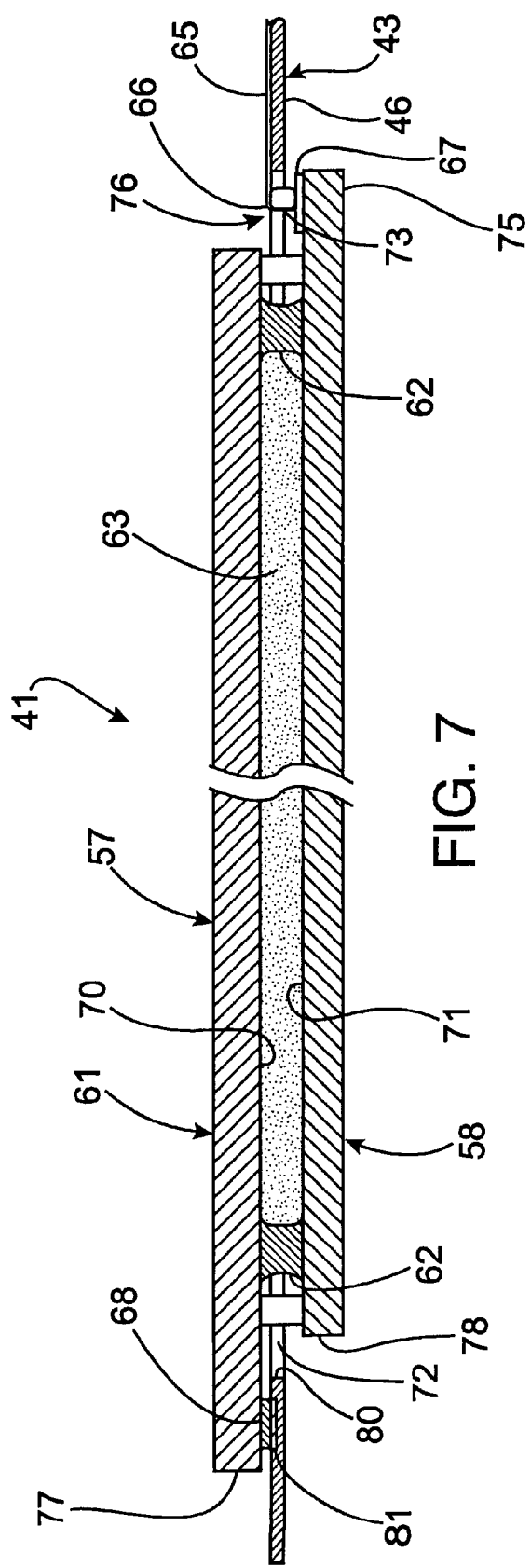
FIG. 7 is an enlarged, fragmentary, side elevation view, in cross-section, of the LCD panel assembly of the present invention, and taken substantially along the plane of the line 7—7 in FIG. 6.

Referring now to FIGS. 6 and 7, another aspect of the present invention is illustrated in which the reflective LCD panel assemblies are mounted to the respective finger portions of the flex circuit device in a manner substantially reducing operational residual stress formation acting upon the die. This Liquid Crystal Display (LCD) panel assembly 41 includes a display device 57 mounted to a finger portion 46 of flex circuit device 43. The display device 57 includes a die, generally designated 58, having a pixel array 60, and a transparent plate 61 positioned over the die 58. An adhesive seal 62 adhesively couples the die 58 to the transparent plate 61. The adhesive seal 62 together with the transparent plate 61 and the die 58 cooperate to define a sealed volume therebetween encompassing the pixel array 60. A liquid crystal material 63 is disposed within the sealed volume. A flex circuit device 43 is provided having a plurality of circuits 65 terminating at respective terminals or beams 66 of a coupling region 47 thereof. The terminals 66 are supportively and communicably coupled to the bond pads 67 of the die 58 for support thereof. Moreover, the coupling region 47 of the flex circuit device 43 further includes an adhesive mount 68 mounting the flex circuit device to the transparent plate 61 to supportably suspend the display device between the die 58 and the transparent plate 61 in a manner substantially minimizing the transmission of residual stresses induced by or acting upon the die 58.

Figure 2:
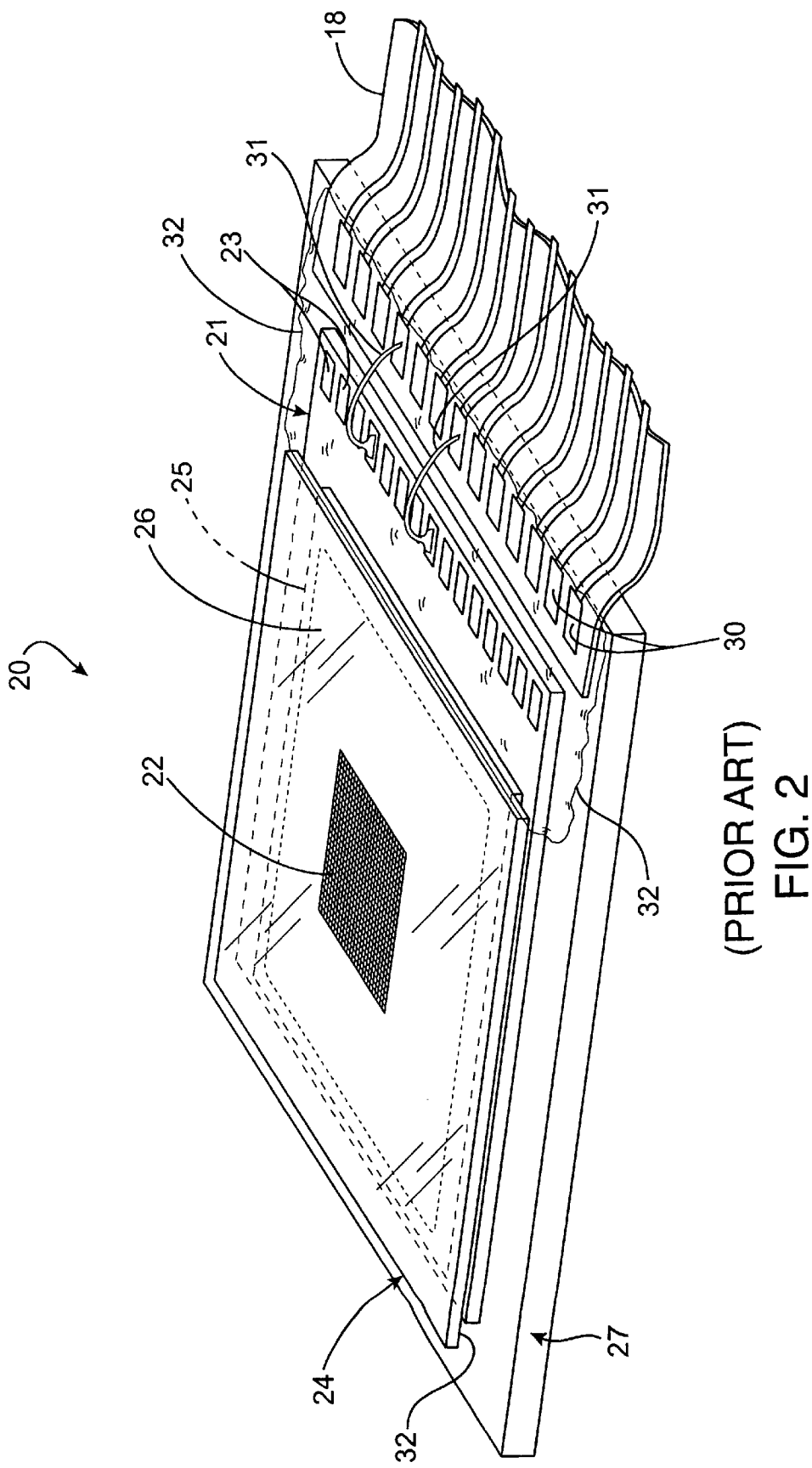
FIG. 2 is a top perspective view of a prior art illustrating a die rigidly mounted to a substrate.
Figure 3:
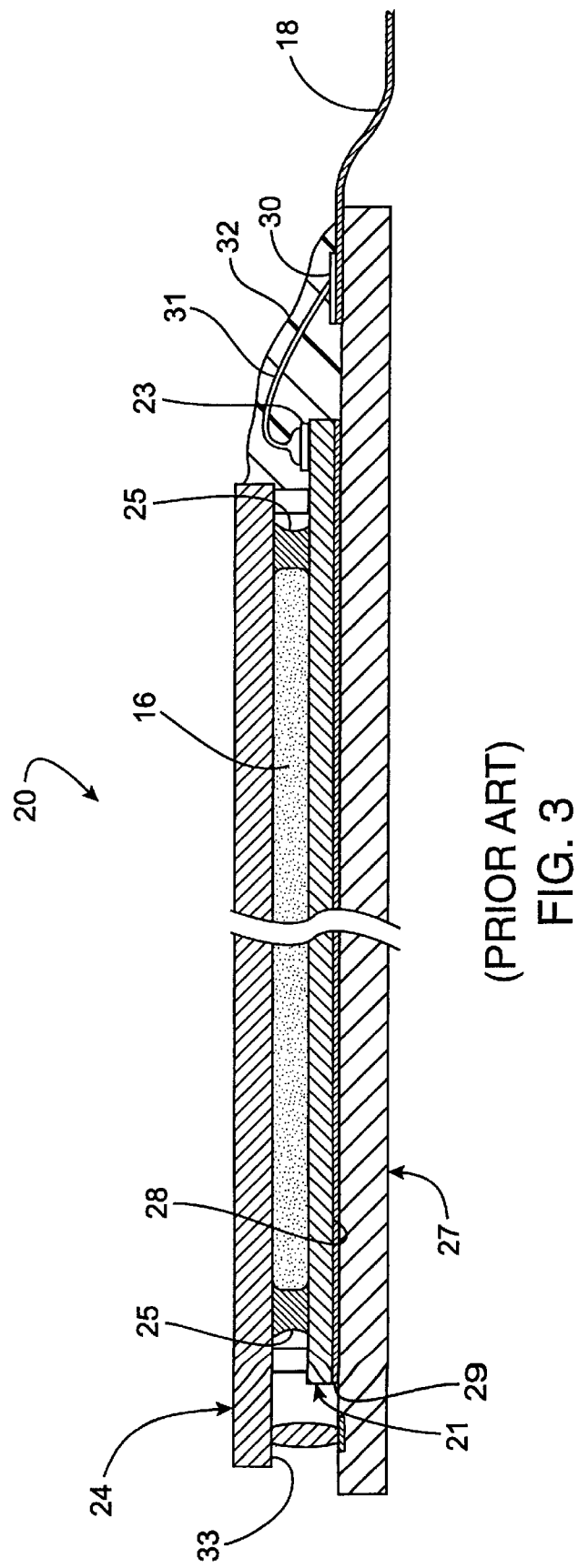
FIG. 3 is an enlarged, fragmentary, side elevation view, in cross-section, of the prior art LCD assembly taken substantially along the plane of the line 3—3 in FIG. 2.

Accordingly, in this configuration, the present invention provides a Liquid Crystal Display panel assembly 41 which substantially reduces stress induced warpage by eliminating the support substrate (i.e., the conventional support substrate 27 in the prior art panel assembly of FIGS. 2 and 3). The planarity of the die is thus better maintained during operation which minimizes the residual stress on the liquid crystal cells. Stress induced transparent plate delimitation is substantially reduced to increase operational longevity. Moreover, since the resulting warpage or bow of display device 57 is substantially reduced during operation, the internal stress induced optical defects, including variations in color uniformity and fringes, and optical shadows are substantially minimized.

Briefly, FIG. 6 illustrates a cross-sectional side elevation view of a small scale LCD assembly 41 having a transparent plate 61 positioned adjacent a planar die 58. The composition of transparent plate 61 may be of any suitable material such as glass and plastic, or the like, providing substantial rigidity. A conductive coating (not shown) may be applied to the undersurface 70 of the plate, such as indium-tin oxide. While the transparent plate 61 is preferably rectangular, it will be understood that the peripheral shape thereof may any geometric shape sufficient to cover the pixel array 60 of the die, while further sufficiently mounting to the display device 57 to the substrate.

The small scale LCD display device 57 includes a pixel array 60 formed on die 58. Die bond pads 67 are preferably disposed on one side of the silicon die 58 which are electrically coupled to pixel array 60 through internal circuitry (not shown) to facilitate control of the pixel array 60. Bond pads 67 also provide electrical connection from the ground and power of the die 58 to the ground and power of a substrate.

An adhesive seal 62 is formed around the pixel array 60 on the top surface 71 of the die 58, and may be applied anywhere within the surface area of die 58 as long as the pixel array 60 is not obscured and the transparent plate 61 can be satisfactorily adhered to the LCD die 58. This adhesive seal 62 further seals a volume between the transparent plate 61, die 58, and within the perimeter of the adhesive seal 62. Pixel array 60 is enclosed within this sealed volume. This adhesive seal 62, accordingly, provides a relatively rigid or semi-rigid mounting of the die 58 to the transparent plate 61. A semi-rigid mounting, therefore, is defined as a mount which provides some elasticity, but for the most part provides a relatively rigid mounting. As will be apparent, this adhesive seal functions as the primary coupling between the die 58 and the transparent plate 61.

Suitable materials known in the art which function as an adhesive and a sealant, and provide semi-rigid mountings include epoxies, acrylics, plastics, polymers and mixtures thereof, or the like. Moreover, a fusible seal may be applied around the pixel array, such as that described in co-pending U.S. patent application Ser. No. 09/056,165, entitled "Fusible Seal for LCD Devices and Methods for Making Same" by Ranjan J. Mathew and Hem P. Takiar, filed Apr. 6, 1998, and incorporated herein by reference in its entirety.

Once the adhesive seal 62 has properly cured, to complete the small scale display device 57, the sealed volume between transparent plate 61, die 58 and adhesive seal 62 can be filled with liquid crystal materials 63. Preferably, these liquid crystal materials are Polymer Dispersed Liquid Crystals which are dispersed in a polymer solution. Other types of liquid crystals 63, however, may be utilized in accordance with the present invention.

In accordance with the present invention, to provide further support to the display device 57 while minimizing residual stress formation during operation, the LCD display device 57 is "floated" or "suspended" from the coupling region 47 of the finger portion 46 of the flex circuit device 43. As best illustrated in FIG. 7, one portion of the flex circuit device 43 is coupled to the die 58 while another portion of the flex circuit device is coupled to the transparent plate 61. The LCD display device 57 is therefore suspended between the die 58 and the transparent plate 61 by the flex circuit device 43. This arrangement is advantageous since the collective coupling of the flex circuit device 43 to the die 58 is generally concentrated at a common region or one end of the die. Therefore, tensile or compressive warpage forces acting upon the die 58 which are caused by the rigid affixation of the die to a rigid structure (such as support substrate 27) are significantly reduced if not eliminated. Similarly, the collective coupling of the flex circuit device 43 to the transparent plate 61 is also generally concentrated at a common region or one end of the transparent plate 61 to minimize tensile or compressive warpage forces acting upon the plate during operation.

In the preferred form, the coupling region 47 of flex circuit device 43 provides a receptacle 72 extending therethrough which is formed and dimensioned for receipt of the LCD panel assembly 41 therein (FIG. 6). The coupling region, thus, essentially forms a flexible ring upon which the display device 57 is mounted. Preferably, one end of the coupling region 47 supportably suspends the die 58 on one side of the receptacle 72, while another portion of the coupling region, on the opposite side of receptacle 72, also supportably suspends the transparent plate 61.

Figure 8:
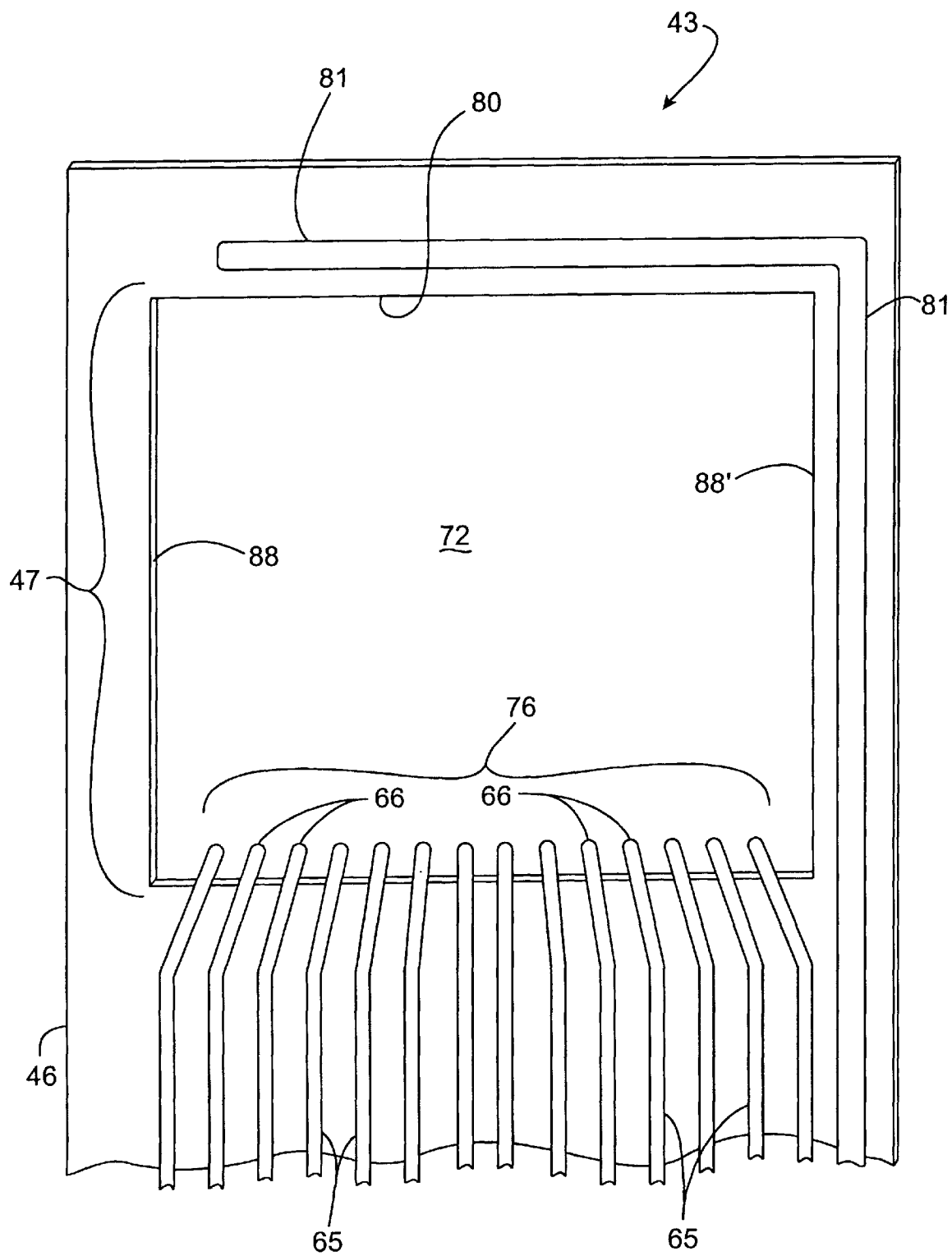
FIG. 8 is a fragmentary, top plan view of a single ringed coupling region of the connection assembly of FIGS. 4 and 6, illustrating the beams for the Tape Automated Bonding interconnection.

The flex circuit device 43 is preferably composed of a relatively thin polyimide material or the like which provides substantial flexibility for the circuits. These ribbon-type circuits further provide sufficient electrical insulation between the adjacent circuits 65 to prevent shorting therebetween. As shown in FIG. 8, these circuits 65 terminate at terminals 66 which extend into a proximal end of the receptacle 72. In the preferred embodiment, these terminals are provided by beams 66 which are components of a Tape Automated Bonding (TAB) interconnection preferably employed to electrically interconnect the circuits to the bond pads 67 of die 58.

At the end of each beam 66 is a solder or gold "ball" 73 (FIG. 7) which electrically couples the respective circuit 65 to the respective bond pad 67. These TAB bond components further function to vertically space the connections (i.e., the bond pads 67 and the circuit beams 66) apart which is necessary to further prevent potential shorting between adjacent circuits and bond pads thereof. Either a "bumped" wafer or a "bump" tape may be employed, depending upon the architecture.

Preferably, the bond pads 67 are positioned at the proximal end of the die 58 which includes an upward facing proximal lip portion 75. As shown in FIG. 7, this proximal lip portion 75 extends beyond a proximal end of the transparent plate 61 for engagement with the circuit beams 66. Once the beams 66 are properly aligned with the corresponding bond pads 67 with solder balls 73, the beams may be TAB bonded for electrical coupling therebetween. Employing thermal compression bonding techniques or thermal sonic bonding techniques in situ, these interconnections are welded together through the solder ball or metalized bump 73 simultaneously.

The application of TAB bonding for this arrangement is advantageous for several reasons. For instance, the structural integrity of the bonds are significantly increased over the conventional bonding wires techniques currently applied (FIGS. 2 and 3). This increased structural integrity also increases bond durability, as well as simplifying alignment between the beams and the corresponding bond pads. Such a durability and strength increase is significant since these bonds not only provide electrical connection, but also perform the function of supportably mounting and suspending the die 58 to the flex circuit device.

The structural improvement of the TAB bonding may also eliminate the necessity of glob coating the terminals. As previously indicated, this glob coating generally introduces additional residual stresses between the die and the transparent plate upon contact therebetween. Accordingly, elimination of this protective coating further maintains planarity of the die. Moreover, the out-gassing of the organic glob materials is reduced which consequently reduces hazing of the transparent plate 61.

To facilitate weight distribution of the LCD panel assembly 41 relative the first coupling to the flex circuit device 43 at the TAB bonding mount 76, a second coupling between the LCD panel assembly and the flex circuit device 43 is provided. This is especially necessary since the TAB bonding mount 76 provides electrical coupling as well as suspended support of the display device 57. While a single cantilever connection of the TAB bonding mount may be structurally sufficient for support thereof, it may potentially adversely affect electrical coupling of one or more of the connections.

This second coupling is preferably provided by an adhesive mount 68 longitudinally spaced-apart from the proximal end TAB bonding mount 76 so that the display device 57 is supportably suspended between the die 58 and the transparent plate 61. As shown in FIGS. 6 and 7, this adhesive mount 68 extends between the flex circuit device 43 and the transparent plate 61, and is positioned proximate a distal region of coupling region 47. More specifically, the adhesive mount 68 is positioned on an opposite distal side of receptacle 72 to provide mounting stability between the spaced supports and the flex circuit device while minimizing residual stresses induced upon the die during operation. This floating technique is further facilitated by the high strength of the silicon die 58 thermally bonded to the transparent plate 61.

The transparent plate 61 preferably includes a distal ledge portion 77 extending beyond a distal end 78 of the die 58, and generally extends laterally from one side of the die to the opposite side thereof. This ledge portion provides a sufficient surface opposing the distal coupling region 47 of the flex circuit device 43 so that the adhesive mount 68 may interconnect the components therebetween. Preferably, the adhesive mount 68 also generally extends laterally from one side of the flex circuit device to the opposite side thereof, generally parallel to a distal edge 80 of the receptacle 72.

While FIG. 6 represents a relatively continuous strip of adhesive mount, it will be appreciated that the adhesive mount may be provided by a single point mount or the like (not shown). Such a point mount will only laterally constrains the transparent plate to the point of attachment. Movement flexibility will be maximized since the point mount of the adhesive mount enables partial pivotal movement between the transparent plate and the flex circuit device. Moreover, it will be understood that two or more spaced-apart adhesive point mounts or segments positioned laterally along coupling region 47 may be provided rather than a continuous adhesive strip without departing from the true spirit and nature of the present invention.

In the preferred embodiment, the polyimide tape of flex circuit device 43 further includes an additional metal or conductive strip 81 extending substantially parallel to and adjacent the circuits 65. This conductive strip 81, as shown in FIG. 8, further extends adjacent the opposite distal side of receptacle 72, generally parallel to the receptacle distal edge 80, and under the ledge portion 77 of transparent plate 61 upon. This metal strip provides a ground for the transparent plate 61 which is electrically and thermally connected thereto through the conductive adhesive mount 68 abovediscussed. Appropriate materials for the conductive adhesive mount 68 may include conductive epoxies or fusible solders.

Figure 9:
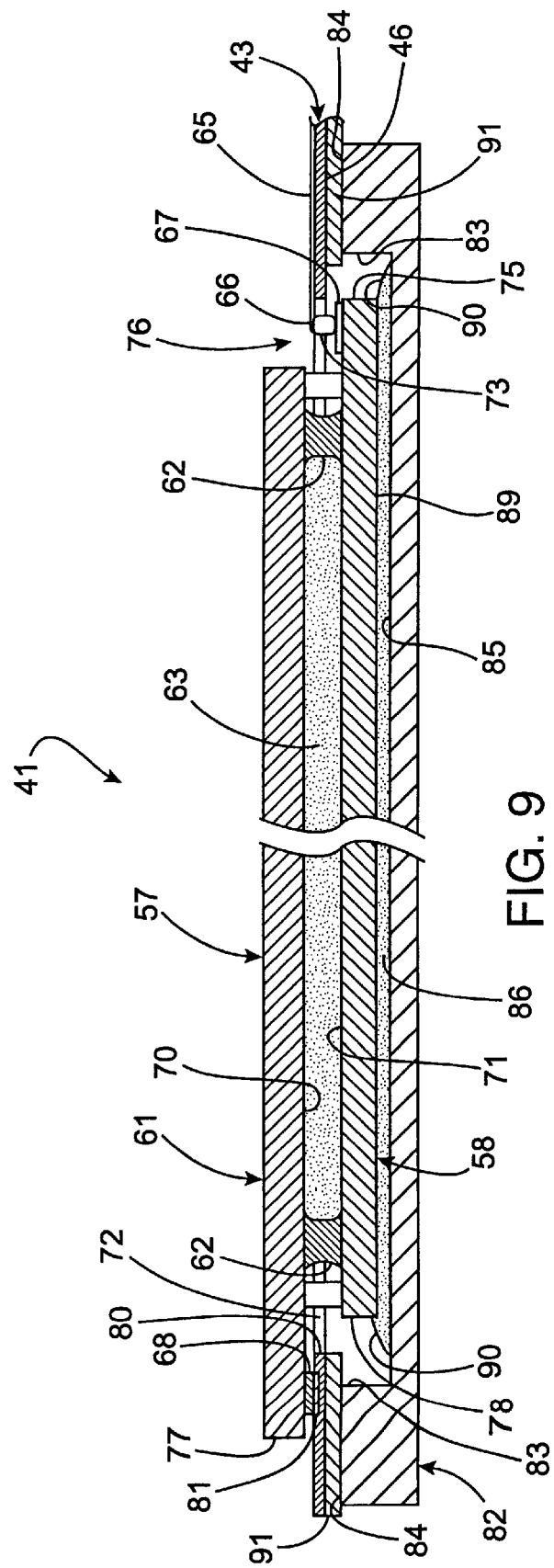
FIG. 9 is a fragmentary, side elevation view, in cross-section, of an alternative embodiment of the flex circuit device assembly of FIG. 7 incorporating a protective cup member.

Referring now to FIG. 9, an alternative embodiment of the present invention is provided in which a protective device, generally designated 82, extends over the backside of die 58 to form a protective shield thereof. Such a protective covering protects the LCD panel assembly from potential damage due to inadvertent contact with the die.

Preferably, a cavity 83 is formed in the protective device top surface 84 which is dimensioned for receipt of the die 58 therein once the LCD display device 57 is rigid or semi-rigid mounted to the flex circuit device 43. As best viewed in FIG. 9, when LCD display device 57 is supportively mounted to and suspended from the respective finger portion 46 of the flex circuit device, the die 58 is seated in the cavity 83 in a fashion non-contacting the interior walls defining the cavity 83 of the protective device 82. Cavity 83 is slightly peripherally larger than the periphery of the die 58, both of which are preferably rectangular in shape. The cavity 83, thus, is defined by four side walls and a floor 85 which extend around and encase the backside of the die. Further, the cavity 83 is of a depth sufficient for substantial non-contact between the die undersurface 89 and the substrate such that a gap 86 is formed between floor 85 of the cavity 83 and the undersurface of the die 58. Accordingly, since the die 58 is non-attached to the substrate, rigidly or semi-rigidly, and is preferably also in non-contact therewith, the die is essentially insulated from the residual stresses of the protective device 82 by being suspended from the transparent plate 61 and the flex circuit device.

The gap 86 formed between the die undersurface 89 and the cavity floor 85 is preferably about 0.5 mm to about 1.0 mm. Cavity 83 may be open to the surrounding air to effect radiation and convection cooling of the die during operation. Thus, air may flow into cavity 83 through a port 87 (FIG. 6) formed between at least one of the opposed side edges 88, 88' defining receptacle and the die 58. This airflow may circulate therein, and then exit through the port 87 for cooling of the die. More preferably, however, a thermoconductive material 90 (FIG. 9) may be positioned in the cavity 83 between and contacting the die undersurface 89 and the cavity floor 85 for heat conduction therebetween. Such thermoconductive material 90 would provide a conductive pathway from the die undersurface 89 through the thermoconductive material 90 and into the protective device 72 for heat dissipation thereof.

It will be appreciated, of course, that the interdisposed thermoconductive material 90 does not rigidly or semi-rigidly mount or affix the die 58 to the protective cover 72. Therefore, the stress induced forces are not transmitted therebetween. However, the thermoconductive material 90 does in part provide vertical support and dampening the between the cavity floor 85 and the die undersurface 89. Preferably, the thermoconductive material is provided by a conventional thermoconductive grease or the like. To further facilitate heat conduction, the protective device may also be composed of a thermoconductive material, such as $Al_2O_3$.

The protective devices may either be coupled to the LCD panel assemblies after they are mounted to the cubic prism device 42, or prior to mounting thereof. Further, to facilitate spacing and from the LCD panel assembly, as well as facilitate bumping of the circuit beams of the TAB bonding interconnection 76, a spacing gasket 91 is positioned between the top surface 84 of the protective device 82 and the undersurface of the flex circuit device 43. Spacing gasket 91 is preferably a non-rigid material such as a polyimide foam or the like.

In another aspect and as apparent from the description of the present invention, a method is provided for packaging a liquid crystal display panel assembly 41. The method includes the steps of: providing a display device 57 including a die 58 having a pixel array 60, a transparent plate 61, an adhesive seal 62 adhesively coupling the die 58 to the transparent plate 61, and a liquid crystal material 63 disposed within a sealed volume formed between the adhesive seal 62, the transparent plate 61 and the die 58. The method then include the steps of coupling the die 58 to one portion of a coupling region 47 of a flex circuit device 43, and coupling the transparent plate 61 to another portion of the coupling region of the flex circuit device 43 spaced-apart from the one portion to supportably suspend the display assembly 41 between the die 58 and the transparent plate 61 in a manner substantially minimizing the transmission of residual stresses induced by or acting upon the die 58.

In one embodiment, the coupling the transparent plate step includes the step of applying an adhesive 68 to not more than a single point location between the transparent plate 61 and the another portion of the coupling region for mounting thereto. Further, the coupling the transparent plate step may include the step of applying an adhesive 68 to not more than a single strip location between the transparent plate 61 and the another portion of the coupling region 47 for mounting thereto.

In still another embodiment, the coupling the die step includes the step of bonding the respective beams 66 to respective bond pads 67 of the die 58 through a Tape Automated Bonding (TAB) interconnection 76 for electrical couple and support therebetween. This bonding step may be performed by one of thermal compression bonding and thermal sonic bonding.

What is claimed is:

1. A liquid crystal display assembly comprising:
    a display device including:
        a die having a pixel array and a plurality of bond pads in electrical communication with the pixel array;
        a transparent plate;
        an adhesive seal adhesively coupling the die to the transparent plate, said adhesive seal, said transparent plate and said die cooperating to define a sealed volume therebetween encompassing the pixel array; and
        a liquid crystal material disposed within the sealed volume; and
    a flex circuit device having a plurality of circuits terminating at respective terminals of a coupling region thereof, said terminals supportively and communicably coupled to said bond pads of said die for support thereof at one portion, and another portion of said coupling region of said flex circuit device further including an adhesive mount for mounting the circuit device to said transparent plate to supportably suspend said display device between said die and said transparent plate in a manner substantially minimizing the transmission of residual stresses induced by or acting upon said die.

2. The liquid crystal display assembly as defined in claim 1 wherein,
    the circuit terminals are coupled to said bond pads at a proximal end of said die, and said adhesive mount suspendably couples said flex circuit device to said transparent plate at an opposite distal end thereof.

3. The liquid crystal display assembly as defined in claim 2 wherein,
    said flex circuit device includes a ground circuit electrically coupled to said adhesive mount, and said adhesive mount being adapted to electrically coupling said transparent plate to said ground circuit for grounding thereof.

4. The liquid crystal display assembly as defined in claim 3 wherein,
    said proximal end of said die includes a proximal lip portion containing said bond pads and formed to extend beyond a proximal end of said transparent plate, and said distal end of said transparent plate includes a distal ledge portion formed to extend beyond a distal end of said die to engage said adhesive mount.

5. A liquid crystal display assembly comprising:
    a display device including:
        a die having a pixel array and a plurality of bond pads in electrical communication with the pixel array;
        a transparent plate;
        an adhesive seal adhesively coupling the die to the transparent plate, said adhesive seal, said transparent plate and said die cooperating to define a sealed volume therebetween encompassing the pixel array; and a liquid crystal material disposed within the sealed volume; and a support device having a plurality of circuits terminating at respective terminals of a coupling region thereof, said terminals supportively and communicably coupled to said bond pads of said die for support thereof at one portion, and another portion of said coupling region of said support device further including an adhesive mount for mounting the support device to said transparent plate to supportably suspend said display device between said die and said transparent plate in a manner substantially minimizing the transmission of residual stresses induced by or acting upon said die.

6. The liquid crystal display assembly as defined in claim 5 wherein, the circuit terminals are coupled to said bond pads at a proximal end of said die, and said adhesive mount suspendably couples said support device to said transparent plate at an opposite distal end thereof.

7. The liquid crystal display assembly as defined in claim 6 wherein, said support device includes a ground circuit electrically coupled to said adhesive mount, and said adhesive mount being adapted to electrically coupling said transparent plate to said ground circuit for grounding thereof.

8. The liquid crystal display assembly as defined in claim 7 wherein, said proximal end of said die includes a proximal lip portion containing said bond pads and formed to extend beyond a proximal end of said transparent plate, and said distal end of said transparent plate includes a distal ledge portion formed to extend beyond a distal end of said die to engage said adhesive mount.

9. The liquid crystal display assembly as defined in claim 5 wherein, said support device includes a flex circuit device.

\* \* \* \* \*